(12) United States Patent
Zweigle et al.

(10) Patent No.: US 7,398,411 B2
(45) Date of Patent: Jul. 8, 2008

(54) SELF-CALIBRATING TIME CODE GENERATOR

(75) Inventors: Gregory C. Zweigle, Pullman, WA (US); Jerry J. Bennett, Moscow, ID (US); Shankar V. Achanta, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 527 days.

(21) Appl. No.: 11/127,747

(22) Filed: May 12, 2005

(65) Prior Publication Data

US 2006/0259806 A1 Nov. 16, 2006

(51) Int. Cl.
*G06F 1/12* (2006.01)

(52) U.S. Cl. .................. 713/400; 713/401; 713/500; 713/503; 702/66; 702/72; 702/85; 702/86; 368/47; 368/52; 375/354; 375/358; 375/359; 375/362; 342/357.12

(58) Field of Classification Search .................. 713/400
See application file for complete search history.

(56) References Cited

U.S. PATENT DOCUMENTS

| | | | |
|---|---|---|---|
| 4,014,166 A | 3/1977 | Cateora et al. | |
| 4,287,597 A | 9/1981 | Paynter et al. | |
| 4,535,306 A | 8/1985 | Yamaguchi | |
| 4,546,486 A | 10/1985 | Evans | |
| 4,582,434 A | 4/1986 | Plangger et al. | |
| 4,808,884 A | 2/1989 | Hull | |
| 5,103,466 A | 4/1992 | Bazes | |
| 5,175,544 A | 12/1992 | McKeen | |
| 5,235,590 A | 8/1993 | Taguchi | |
| 5,793,869 A | 8/1998 | Claflin | |
| 5,963,382 A | 10/1999 | Abe | |
| 5,995,911 A | 11/1999 | Hart | |
| 6,377,585 B1 | 4/2002 | Funderburk et al. | |

(Continued)

FOREIGN PATENT DOCUMENTS

GB 2278519 11/1994

(Continued)

OTHER PUBLICATIONS

SEL-2407 GPS Clock Instruction Manual (Mar. 2005).

(Continued)

*Primary Examiner*—Nitin C. Patel
(74) *Attorney, Agent, or Firm*—Cook, Alex, McFarron, Manzo, Cummings & Mehler, Ltd.

(57) ABSTRACT

Provided is a self-calibrating time code generator and method for generating an accurate time code (e.g., an accurate IRIG waveform). The self-calibrating time code generator includes a phase-locked loop configured to provide a generated output signal based on a phase difference between an absolute time reference signal and a compensated generated input signal, an IRIG encoder configured to couple a present time value with the generated output signal to form an IRIG waveform, a delay difference indicator configured to provide a time interval value based on a comparison of corresponding pulse edges of the generated output signal and the IRIG waveform, and a numerical delay component configured to delay the generated output signal by the time interval value to form the compensated generated input signal used to time-align the IRIG waveform with the absolute time reference signal to form the accurate IRIG waveform.

30 Claims, 5 Drawing Sheets

U.S. PATENT DOCUMENTS

| | | |
|---|---|---|
| 6,381,701 B1 | 4/2002 | Takai |
| 6,456,831 B1 | 9/2002 | Tada |
| 6,611,922 B2 | 8/2003 | Ozcetin et al. |
| 6,618,648 B1 | 9/2003 | Shirota |
| 6,678,134 B2 | 1/2004 | Sugiura et al. |
| 6,754,210 B1 | 6/2004 | Ofek |
| 6,859,742 B2 | 2/2005 | Randall et al. |
| 6,879,917 B2 | 4/2005 | Turner |
| 6,888,274 B2 | 5/2005 | Woydt |
| 6,891,441 B2 | 5/2005 | Rochow |
| 6,937,683 B1 | 8/2005 | Ratzel |
| 7,272,201 B2 | 9/2007 | Whitehead |
| 2001/0023464 A1 | 9/2001 | Deck |

FOREIGN PATENT DOCUMENTS

| | | |
|---|---|---|
| JP | 10247377 | 9/1998 |
| WO | WO 00/16525 | 3/2000 |
| WO | WO 00/57527 | 9/2000 |

OTHER PUBLICATIONS

US Army RCC, IRIG Serial Time Code Formats, IRIG Standard 200-98, May 1998.

Brandywine Communications, User Guide GPS Time and Frequency System Model GPS8 Plus, Oct. 2004.

IEEE, IEEE Standard of Synchrophasors for Power Systems, IEEE Standard 1344-1995, May 27, 1996.

SELF-CALIBRATING TIME CODE GENERATOR

CROSS-REFERENCE TO RELATED APPLICATIONS

None

BACKGROUND OF THE INVENTION

The present invention generally relates to self-calibrating time sources, and more specifically, to a self-calibrating time code generator that dynamically compensates for time delays to generate an accurate time code waveform.

A self-calibrating time source may be used to provide calendar and time-of-year information to a variety of devices for a variety of reasons. For example, sequential events recorders record occurrences of events, and then store a record of each occurrence in a report. The time of the occurrence of each event is also included with the event in the report. The time of the occurrence stored for each event is often derived from a time code generator. Thus, the more accurate the self-calibrating time source, the more accurate the recorded time of each event occurrence in the report.

Self-calibrating time sources may also be used to provide synchronization for various devices. For example, some devices are configured to take a number of measurements of an ongoing process at precisely predefined instants of time. Such a device may be required to measure a process parameter such as a voltage, a current, a temperature, a strain measurement, etc., once per second exactly on the second, (e.g., the measurements must be taken exactly at midnight, exactly one second after midnight, exactly two seconds after midnight, etc.). For example, digital fault recorders used in the power system industry require sampling of data from a power line, referenced to time. As a result, such devices often synchronize their measurement activities to a time code generator. Thus, the more accurate the self-calibrating time source, the more accurate the measurement timing.

Implementation of a time source often introduces inherent time delays. That is, the design of, and the components used to implement the time source are often responsible for inherent time delays during operation. Noise coupling into the time source, and loading or line-induced delays may also contribute to time delays. In addition, the time delays may dynamically vary over time, due to temperature variations or component aging. Such delays directly reduce the time accuracy and therefore the performance of the devices requiring the time information.

SUMMARY OF THE INVENTION

In accordance with an embodiment of the invention, provided is a self-calibrating time code generator and method that dynamically measures and compensates for time delays to generate an accurate time code waveform. The self-calibrating time code generator is included in a time source to generate the accurate time waveform for timing and synchronization use by one or more device(s) or loads.

In accordance with an aspect of the invention, provided is a self-calibrating time code generator for generating an accurate time waveform suitable for timing use by a device or load. The self-calibrating time code generator is configured to compensate for one or more of a component delay, an implementation delay and a line-loading delay. The self-calibrating time code generator includes a phase-locked loop configured to provide a generated output signal based on a phase difference between an absolute time reference signal provided by a global positioning system receiver, and a compensated generated input signal. The self-calibrating time code generator further includes a time data encoder operatively coupled to the phase-locked loop and configured to couple a present time value with the generated output signal to form the accurate time waveform, and a frequency divider operatively coupled to the time data encoder and configured to form the compensated generated input signal having an edge rate different from an edge rate of the accurate time waveform.

In accordance with another aspect of the invention, provided is another self-calibrating time code generator for generating an accurate digital IRIG waveform suitable for timing use by a device or load. The self-calibrating time code generator includes a phase-locked loop configured to provide a generated output signal based on a phase difference between the absolute time reference signal and a compensated generated input signal, and an IRIG encoder configured to couple the present time value with the generated output signal to form a digital IRIG waveform. The compensated generated input signal includes a time delay of the self-calibrating time code generator. The self-calibrating time code generator also includes a dynamic delay compensator configured as a separate feedback control path to provide the compensated generated input signal based on the generated output signal and the digital IRIG waveform. The dynamic delay compensator includes a delay difference indicator configured to provide a time interval value based on a comparison of corresponding pulse edges of the generated output signal and the digital IRIG waveform, where the time interval value represents the time delay of the self-calibrating time code generator, and a numerical delay component configured to delay the generated output signal by the time interval value to form the compensated generated input signal, where receipt of the compensated generated input signal by the phase-locked loop causes the generated output signal to lead the absolute time reference signal by the time interval value to time-align the digital IRIG waveform with the absolute time reference signal to form the accurate digital IRIG waveform.

In accordance with yet another aspect of the invention, provided is yet another self-calibrating time code generator for generating an accurate analog IRIG waveform suitable for timing use by a device. The self-calibrating time code generator includes a phase-locked loop configured to provide a generated output signal based on a phase difference between an absolute time reference signal and a compensated generated input signal, an IRIG encoder configured to couple a present time value with the generated output signal to form a digital IRIG waveform, and an plurality of analog components configured to transform the digital IRIG waveform into a conditioned analog IRIG waveform. The self-calibrating time code generator also includes a delay difference indicator configured to provide a time interval value based on a comparison of corresponding pulse edges of the generated output signal and an IRIG edge-arrival time waveform formed from the conditioned analog IRIG waveform where the time interval value represents a time delay of the self-calibrating time code generator, and a numerical delay component configured to delay the generated output signal by the time interval value to form the compensated generated input signal, where receipt of the compensated generated input signal by the phase-locked loop causes the generated output signal to lead the absolute time reference signal by the time interval value to time-align the conditioned analog IRIG waveform with the absolute time reference signal to form the accurate analog IRIG waveform.

In accordance with a further aspect of the invention, provided is a method for self-calibrating a time-code generator to time-align an IRIG waveform generated by the time-code generator with an absolute time reference signal to form an accurate IRIG waveform. The time-code generator includes a phase-locked loop adapted to provide a generated output signal based on a phase difference between the absolute time reference signal and a compensated generated input signal. The method includes providing a delay difference indicator configured to calculate a time interval value based on a comparison of a pulse edge of the IRIG waveform and a corresponding pulse edge of the generated output signal, where the time interval value is representative of a time delay of the time-code generator. The method also includes providing a numerical delay component configured to delay the generated output signal by the time interval value to form the compensated generated input signal, where receipt of the compensated generated input signal by the phase-locked loop causes the generated output signal to lead the absolute time reference signal by the time interval value to time-align the IRIG waveform with the absolute time reference signal to form the accurate IRIG waveform.

It should be understood that the present invention includes a number of different aspects or features which may have utility alone and/or in combination with other aspects or features. Accordingly, this summary is not exhaustive identification of each such aspect or feature that is now or may hereafter be claimed, but represents an overview of certain aspects of the present invention to assist in understanding the more detailed description that follows. The scope of the invention is not limited to the specific embodiments described below, but is set forth in the claims now or hereafter filed.

DETAILED DESCRIPTION OF THE INVENTION

Unlike prior art methods where, for example, delay corrections are used to correct delays due to satellite transmission of the absolute time reference signal, the self-calibrating time code generators described herein corrects any delays, in real-time, due to distribution of the accurate digital IRIG waveform.

Figure 1:
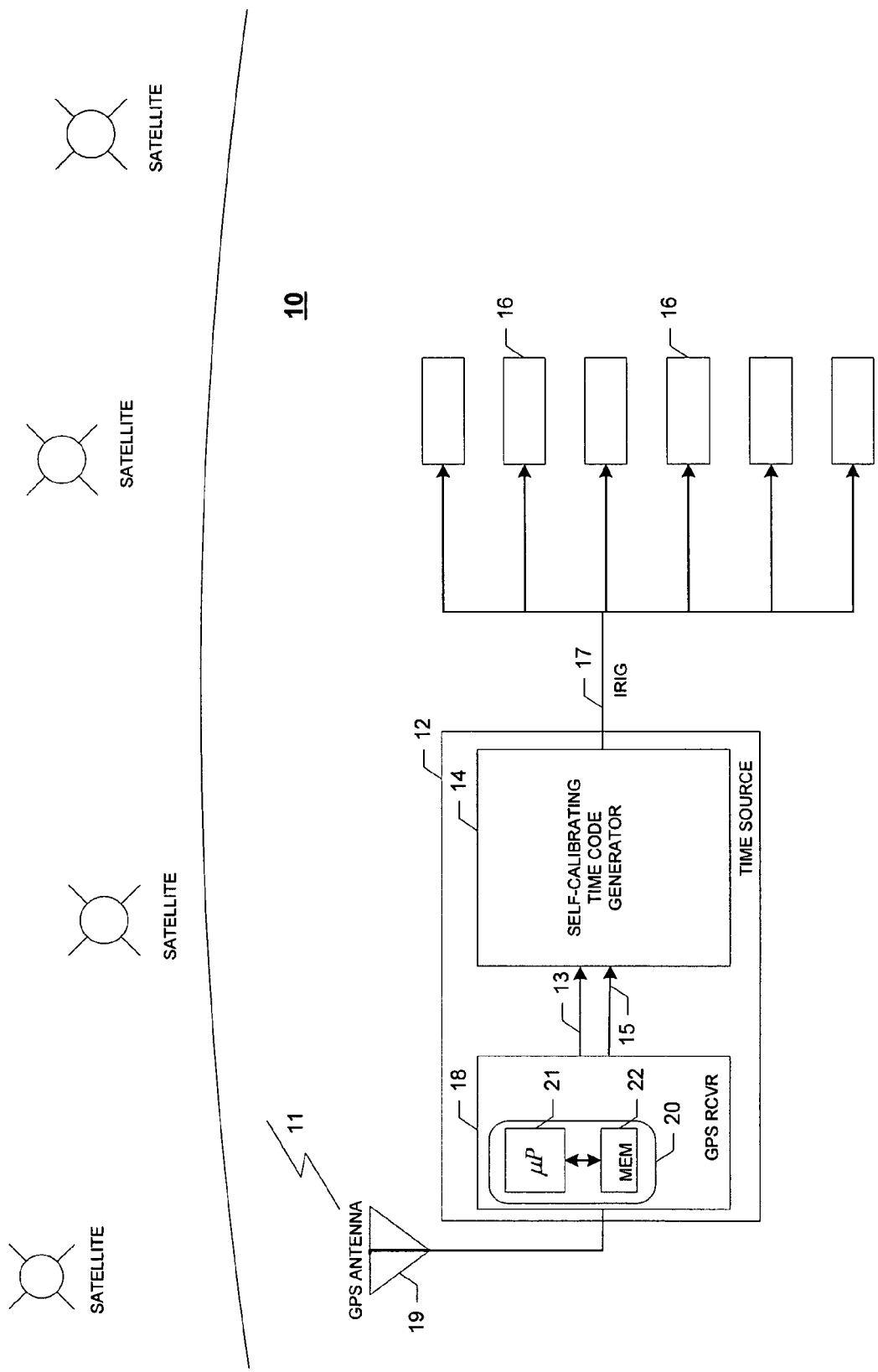
FIG. 1 is a block diagram of a self-calibrating time source system, according to an embodiment of the invention.

FIG. 1 is a block diagram of a time source system 10 according to an embodiment of the invention. The time source system 10 includes a time source 12 configured to generate an accurate time waveform suitable for timing and synchronization use by one or more device(s) 16. Such an accurate time waveform may be used by the device(s) 16 to, for example, provide accurate "time stamps" for events monitored and recorded by the device(s) 16, or enable synchronization for a group of devices 16. Although discussed below as a digital IRIG waveform or a conditioned (modulated) analog IRIG waveform, the accurate time waveform is hereinafter referred to as the IRIG waveform 17 (Inter Range Instrument Group time code standard). Such an IRIG waveform 17 may be delivered to the device(s) 16 via any one of a TTL level over coaxial cable, an RS 422 level over a twisted pair, an RS 232 level over a shielded cable and a fiber optic cable, to name a few. Further, although the accurate time waveform is discussed in terms of the IRIG waveform 17, any waveform representative of an absolute time with a reference signal edge may be used.

As is known, the IRIG standard includes a family of rate-scaled serial time codes with formats containing up to three coded expressions or words. The IRIG-B time code is one possible format. The IRIG-B time code includes a series of binary pulses where each of the binary pulses contains one "frame" of 100 "elements" per second for the time of year in binary coded decimal (BCD) notation in days, hours, minutes and seconds. The IRIG-B format encodes time-of-year on a 1 kHz carrier frequency, with a time value update rate of once per second.

Referring to FIG. 1, the time source 12 includes a GPS receiver 18, coupled to a self-calibrating time code generator 14. In general, the GPS receiver 18 may include a microcontroller 20 (or other programmable device) coupled to a GPS antenna 19. The microcontroller 20 includes a microprocessor 21 and a memory 22 operatively coupled to the microprocessor 21. In an embodiment, the self-calibrating time code generator 14 preferably includes a field programmable gate array (FPGA) configured to provide a digitally encoded IRIG waveform ("digital IRIG waveform"). In another embodiment, the self-calibrating time code generator 14 includes the FPGA and a number of analog components to convert the digital IRIG waveform to a (modulated) conditioned analog IRIG waveform suitable for analog transmission to the device(s) or loads 16.

The microcontroller 20 is configured to decode signals 11 received via the GPS antenna 19 and to calculate a present time value 13. The present time value 13 includes the present time-of-year in days, hours, minutes and seconds, encoded in a multi-bit binary signal (e.g., 10011). The GPS receiver 18 is also configured to provide an accurate absolute time reference signal 15 that is a one pulse-per-second (1 pps) signal, where the time between corresponding positive leading edges of two sequential pulses is one second ("a one-second time frame"). As will be described in detail below, both the present time value 13 and the accurate time reference signal 15 are utilized by the self-calibrating time code generator 14 to generate the IRIG waveform 17 (e.g., the digital IRIG waveform or the conditioned analog IRIG waveform).

During operation, the time source 12 provides the IRIG waveform 17, or the accurate time waveform, to the device(s) or loads 16 at the instant in time referred to by the IRIG waveform 17. That instant in time is indicated by a positive leading edge of one of the binary pulses of the IRIG time code (i.e., the positive leading edge of an 8 millisecond (ms) binary pulse occurring 2 ms after a previous 8 ms binary pulse) forming the IRIG waveform 17. The accuracy in time of the placement of that positive leading edge is determinative of the accuracy of the self-calibrating time code generator 14. Thus, in the absence of self-calibration, if time code generator implementation or the connectivity (e.g., loaded twisted pair) used to deliver the IRIG waveform 17 causes the positive leading edge of the binary pulse to be delayed, operation of the device(s) 16 is adversely affected and/or degraded.

Although GPS technology is utilized in the embodiments described herein, it is contemplated that any suitable technology may be utilized to provide the present time value 13 and the time reference signal 15. Further, although configured to generate the IRIG waveform 17, it is contemplated that the self-calibrating time code generator 14 may be adapted to generate other suitable types of accurate time waveforms using the principles described herein.

Figure 2:
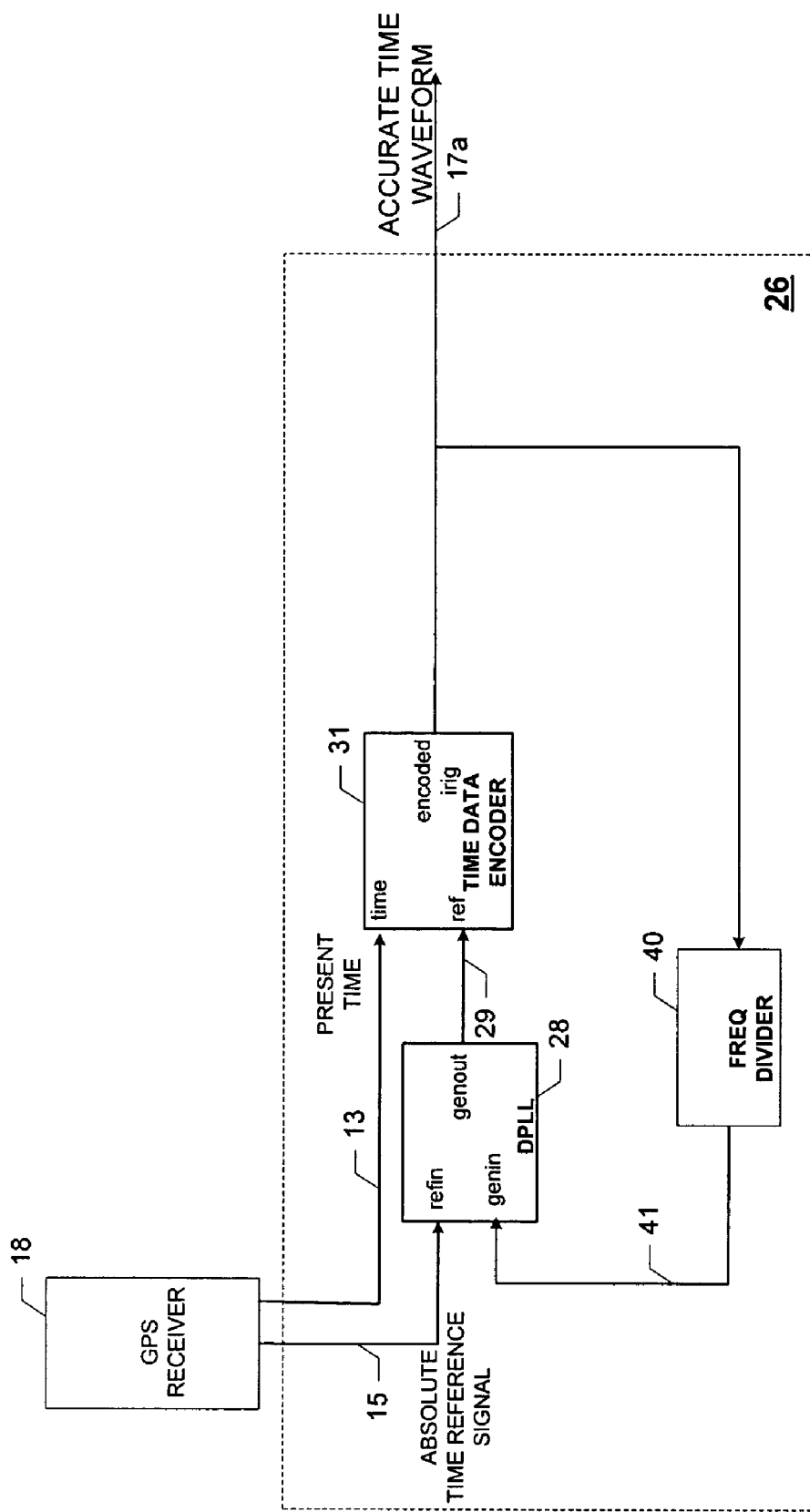
FIG. 2 is a block diagram of a self-calibrating time code generator of the system of FIG. 1 that may be utilized to generate an accurate time waveform, according to an embodiment of the invention.

In general, the self-calibrating time code generator 14 is configured to compensate for, or remove, delay introduced via the components of the self-calibrating time code generator 14 and or any other delay introduced via the actual connections between the time source generator 12 and the device(s) or load(s) 16 (i.e., delays due to distribution of the accurate time waveform). It is also configured to compensate for those delays even in the presence of severe noise events such as ESD. For example, FIG. 2 is a block diagram of a self-calibrating time code generator 26 that may be utilized to generate an accurate time waveform, according to an embodiment of the invention. Like the self-calibrating time code generator of FIG. 1, the self-calibrating time code generator 26 utilizes the absolute time reference signal 15 and the present time value 13. Configured using a phase-locked loop arrangement as described below, the self-calibrating time code generator 26 generates the accurate time waveform for timing and synchronization use by the device(s) or load 16.

In general, a PLL utilizes an oscillator (voltage- or current-driven), in a closed loop arrangement that is continually adjusted to match in phase the frequency of an input signal. The oscillator operates to lock onto the frequency of the input signal. More specifically, during operation, the PLL compares frequencies of a first input signal (or reference signal) and a second input signal (feedback signal) and generates a resulting output signal based on a phase difference between the first and second input signals. The phase difference between the first and second input signals is filtered and used to control the oscillator, which generates the output signal. The second input signal is based on the resulting output signal in a feedback arrangement. Accordingly, the oscillator drives the phase difference between the first and a second input signals to zero and is designed to operate in the presence of noise such as clock jitter, and to compensate for any time shifts or delays introduced by the components of the PLL.

Traditional PLLs were implemented using analog electronic components such as amplifiers, phase detectors, loop filters and voltage controlled oscillators. Present PLL applications often utilize microprocessors or other configurable logic devices to implement a digital PLL (DPLL). Similar to the analog PLL, the DPLL operates by comparing the frequencies of a first and a second input signal to generate a resulting output signal based on a phase difference of the first and second input signal. Unlike the analog PLL, the phase difference of the DPLL is represented numerically, and when filtered, is utilized by a numerical oscillator to generate the output signal.

In some PLL and DPLL designs, the phase difference is determined based on the relative timing of positive leading or negative leading pulse edges of the first and second input signals. Thus, the resulting output signal depends upon whether the second input signal pulse transitions occur before or after the pulse transitions of the first input signal, respectively.

A PLL or DPLL may also be adapted to multiply the frequency of a time reference signal received via the first input (e.g., a 1 pps signal), by a constant, while simultaneously maintaining phase reference to the signals received via the first and second inputs. Accordingly, the rate of the resulting output signal is scaled from the 1 pps time reference signal, to a rate that is consistent with an output signal rate. In the case of an IRIG-B output signal, the positive leading edges of the scaled output signal may occur, for example, every 10 ms (or 100 pulses-per-second). As a result, the output signal is a frequency scaled version of the time reference signal.

Referring again to FIG. 2, the self-calibrating time code generator 26 includes a DPLL 28 having a first input ref$_{IN}$ adapted to receive the absolute time reference signal 15, a second input gen$_{IN}$ adapted to receive a generated input signal 41, and an output gen$_{OUT}$ adapted to provide a generated output signal 29. The generated output signal 29 is based on the phase difference between the absolute time reference signal 15 and the generated input signal 41. In an embodiment, the phase difference is determined by the relative timing of positive leading pulse edges of the absolute time reference signal 15 and the generated input signal 41. Further, although illustrated using a DPLL 28, it is contemplated that that a PLL may also be utilized.

During operation, the DPLL 28 compares the phase of the absolute time reference signal 15 to the phase of the generated input signal 41 to form the generated output signal 29. In the instant example, each of the absolute time reference signal 15 and the generated input signal 41 is a 1 pps signal where the sequential positive leading pulse edges are one second apart. A frequency divider 40 operates to change the rate of the edges of the accurate time waveform 17a (discussed below) from a first rate, for example a 100 pps rate, to a second rate such as the 1 pps rate of the generated input signal 41. Accordingly, the frequency divider 40 is configured to form the compensated generated input signal 29 where an edge rate of the compensated generated input signal 29 is different from an edge rate of the accurate time waveform. Although described in terms of 1 pps signals, it is contemplated that each of the absolute time reference signal 15, the generated input signal 41 and the generated output signal 29 may include additional pulses-per second configurations, depending on the implementation of the absolute time reference signal 15.

The generated input signal 41 is a feedback signal that is based on the generated output signal 29. A phase difference (either lead or lag) between the absolute time reference signal 15 and the generated input signal 41 controls operation of a numerical oscillator (not separately illustrated) of the DPLL 28, where the oscillator generates the output signal 29. Operation of the oscillator drives any phase difference between the absolute time reference signal 15 and the generated input signal 41 to zero to compensate for any time shift or delay introduced by the components of the self-calibrating time code generator 26. The generated output signal 29 is therefore representative of the absolute time reference signal 15, shifted in time.

The self-calibrating time code generator 26 also includes a time data encoder 31 coupled to the DPLL 28. The time data encoder 31 may be any suitable encoder configured to encode time information into a serial waveform with periodic edges that represent an absolute time (e.g., an IRIG encoder). Accordingly, the time data encoder 31 has a first input time adapted to receive the present time value 13 and a second input ref adapted to receive the generated output signal 29. Although preferably implemented in a configurable logic device such as an FPGA, it is contemplated that both the DPLL 28 and the time data encoder 31 may be implemented via a microcontroller such as the microcontroller 20 of FIG. 1, depending on the performance capability of the selected microcontroller.

The time data encoder 31 is configured to couple the generated output signal 29 with the present time value 13, and generate a digitally encoded waveform, or the accurate time waveform 17a. In the case of an IRIG-B standard, the time-of-year provided by the present time value 13 is represented by the 100 pulses (or elements) in a one-second time frame.

For example, using the IRIG-B standard, during operation of the time data encoder 31, a one-second time frame of the 1 pps generated output signal 29 is encoded with the 100 elements of the IRIG-B standard starting at the instant in time of receipt of a first positive leading pulse edge of the one-second time frame of the 1 pps generated output signal 29. Thus, upon receipt of the 1 pps generated output signal 29, the time data encoder 31 starts to generate a 100 pps accurate time waveform 17a. The accurate time waveform 17a represents the present time value 13 encoded, via 100 ten-millisecond pulses, in a one-second time frame of the "shifted" absolute time reference signal 15. Although the ten-millisecond pulses are provided via operation of the time date encoder 31 using, for example, an IRIG standard, it is contemplated that the DPLL 28 may multiply or scale the 1 pps absolute time reference signal 15 as described above to generate the ten-millisecond pulses subsequently used by the time data encoder 31 to encode the present time value 13.

In some applications such as those in the power system industry, the accurate time waveform 17a may be transmitted via heavily loaded lines such as long distance coax cables connected to multiple devices or loads 16 of FIG. 1. Accordingly, line-induced reductions in the signal waveform slope of the accurate time waveform 17a may result in timing or synchronizing inaccuracies in the devices or loads 16. To minimize potential pulse edge rate limitations and line-induced delay distortions on associated analog signal processing components, the self-calibrating time code generator 26 may also include one or more an analog drivers (see, FIG. 3) to drive the accurate time waveform 17a.

For applications utilizing, for example, fiber optic transmission, the accurate time waveform 17a may be configured as a digital accurate time waveform for direct transmission to and utilization by the device(s) or loads 16 of FIG. 1. For applications utilizing, for example, coaxial cable transmission, the accurate time waveform 17a may be further processed to form an analog accurate time waveform. In such cases, the self-calibrating time code generator may additionally include a digital-to-analog converter (DAC) and an associated analog signal processing component. Using an IRIG standard, a modulation operation may be performed numerically within the time data encoder 31 using an amplitude modulated 1 KHz sinusoidal value stored in a look-up table.

Figure 3:
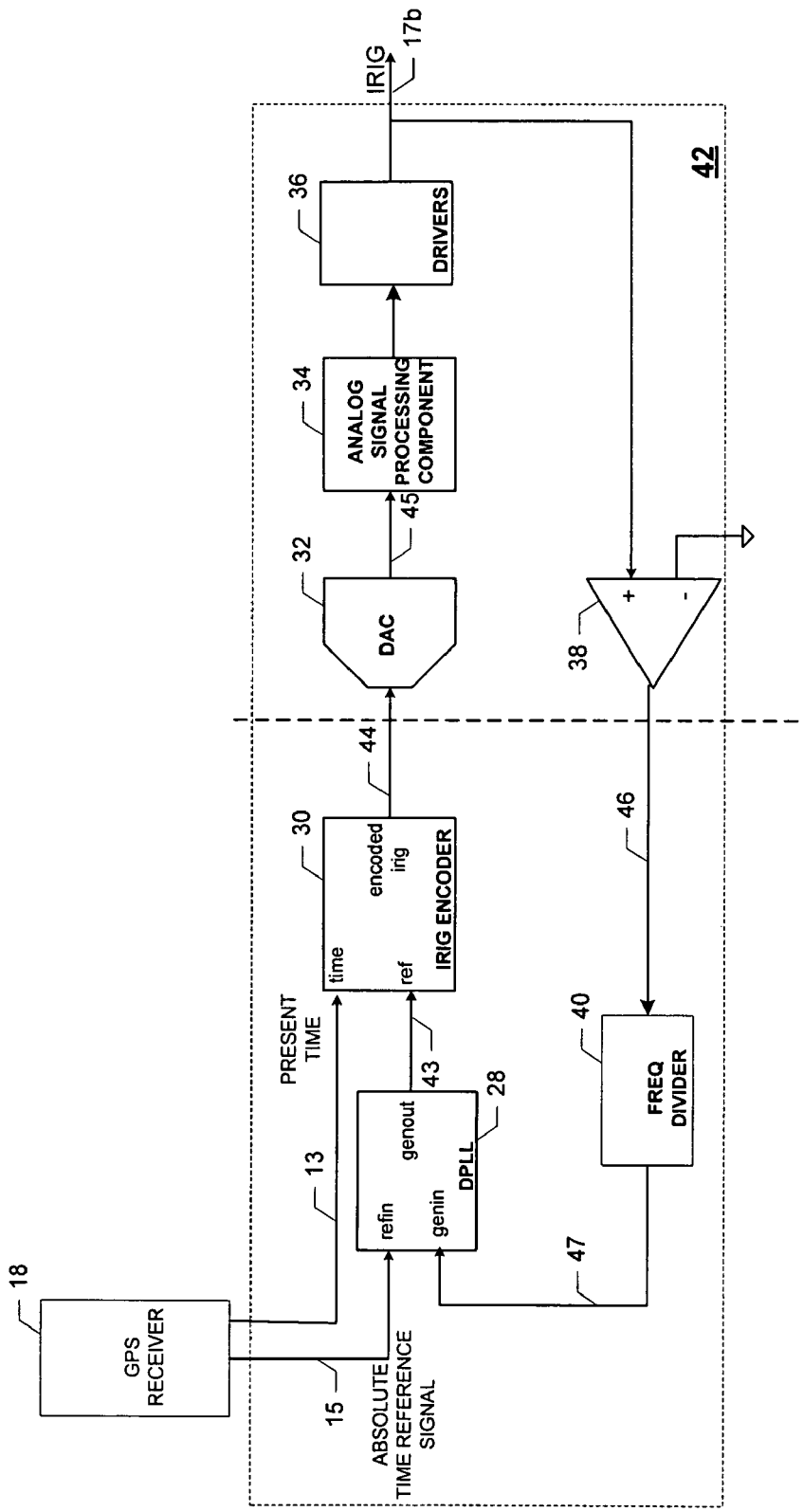
FIG. 3 is a block diagram of another self-calibrating time code generator of the system of FIG. 1 that may be utilized to generate the accurate time waveform, according to another embodiment of the invention.

For example, FIG. 3 is a block diagram of another self-calibrating time code generator 42 that may be utilized to generate an accurate time waveform configured as an IRIG waveform 17b, according to another embodiment of the invention. As illustrated, the self-calibrating time code generator 42 includes the DPLL 28, an IRIG encoder 30, the frequency divider 40 and a driver(s) 36, configured and operational as described above. The self-calibrating time code generator 42 additionally includes a DAC 32 operatively coupled to the IRIG encoder 30, an analog signal processing component 34 operatively coupled to the DAC 32 and a comparator 38 operatively coupled between the driver(s) 36 and the frequency divider 40. Although discussed in terms of IRIG-B, it is contemplated that other IRIG time codes (e.g., IRIG-A) may be used by the IRIG encoder 30.

The DAC 32 operates to convert a digital IRIG waveform 44 provided by the IRIG encoder 30 into a modulated analog signal 45 representative of the digital IRIG waveform 44. The modulated analog signal 45 is then amplified, offset shifted and filtered using well-known techniques via the analog signal processing component 34 to form the IRIG waveform 17b configured as a conditioned analog IRIG waveform.

In cases where the IRIG waveform 17b is configured as the conditioned analog IRIG waveform, a comparator 38 is included in the self-calibrating time code generator 42 to form an IRIG edge-arrival time waveform 46 suitable for use by the DPLL 28 after being frequency divided by the frequency divider 40 to form a generated input signal 47. The comparator 38 is configured to detect the zero crossings of the conditioned analog IRIG waveform and to generate the IRIG edge-arrival time waveform 46 comprising a series of pulses. The series of pulses are constructed from the modulated analog IRIG waveform such that each positive zero crossing of the analog IRIG waveform is constructed as a positive leading edge of a pulse, and each negative zero crossing of the analog IRIG waveform is constructed as a corresponding negative edge of the pulse. The time instant of the first positive zero crossing, or the positive leading edge of a first pulse of a one-second time frame is indicative of the delay of the IRIG waveform 17b due to the IRIG encoder 30, the DAC 32, the analog signal processing component 34 and the driver(s) 36.

Due to the DPLL design tradeoff between accuracy and acquisition time, an undesirable time delay may be introduced into the self-calibrating time code generator 42. That is, when DPLL accuracy is optimized, the time that it takes for the DPLL 28 to meet its nominal accuracy requirement in response to an impulse, a step or a ramp change, is increased. Conversely, when DPLL acquisition time is optimized, the accuracy of the DPLL 28, or its ability to drive the phase difference between the absolute time reference signal 15 and the generated input signal 47 to zero, is compromised.

In cases where accuracy is optimized for applications such as those described herein, any noise event coupled to operation of the DPLL 28 may cause the self-calibrating time code generator 42 to exceed a specified time accuracy requirement. In general, a DPLL is well-suited for filtering noise due to signal jitter and the like. For some high noise application environments however, the overall noise filtering provided by a DPLL may be degraded during severe noise events or large transient signals. Such degraded performance may be unavoidable unless the DPLL operates within a very narrow bandwidth, yielding an undesirable longer acquisition time.

For example, commutation of high energy circuits such as those found in electric power systems, can result in large transient signals. Faulted conditions in an electric power system (e.g., a short circuit) can also result in such transient signals. The transient signals may include long duration oscillatory signals, bursts of noise and large impulse events, all of which adversely impact DPLL noise filtering performance. The source of the transient signals may also appear on the IRIG waveform 17b and then on the generated input signal 47 due to, for example, inductive coupling between the self-calibrating time code generator 42 and nearby current carrying wires. Electrostatic discharge (ESD) may also adversely impact operation of the self-calibrating time code generator 42.

Figure 4:
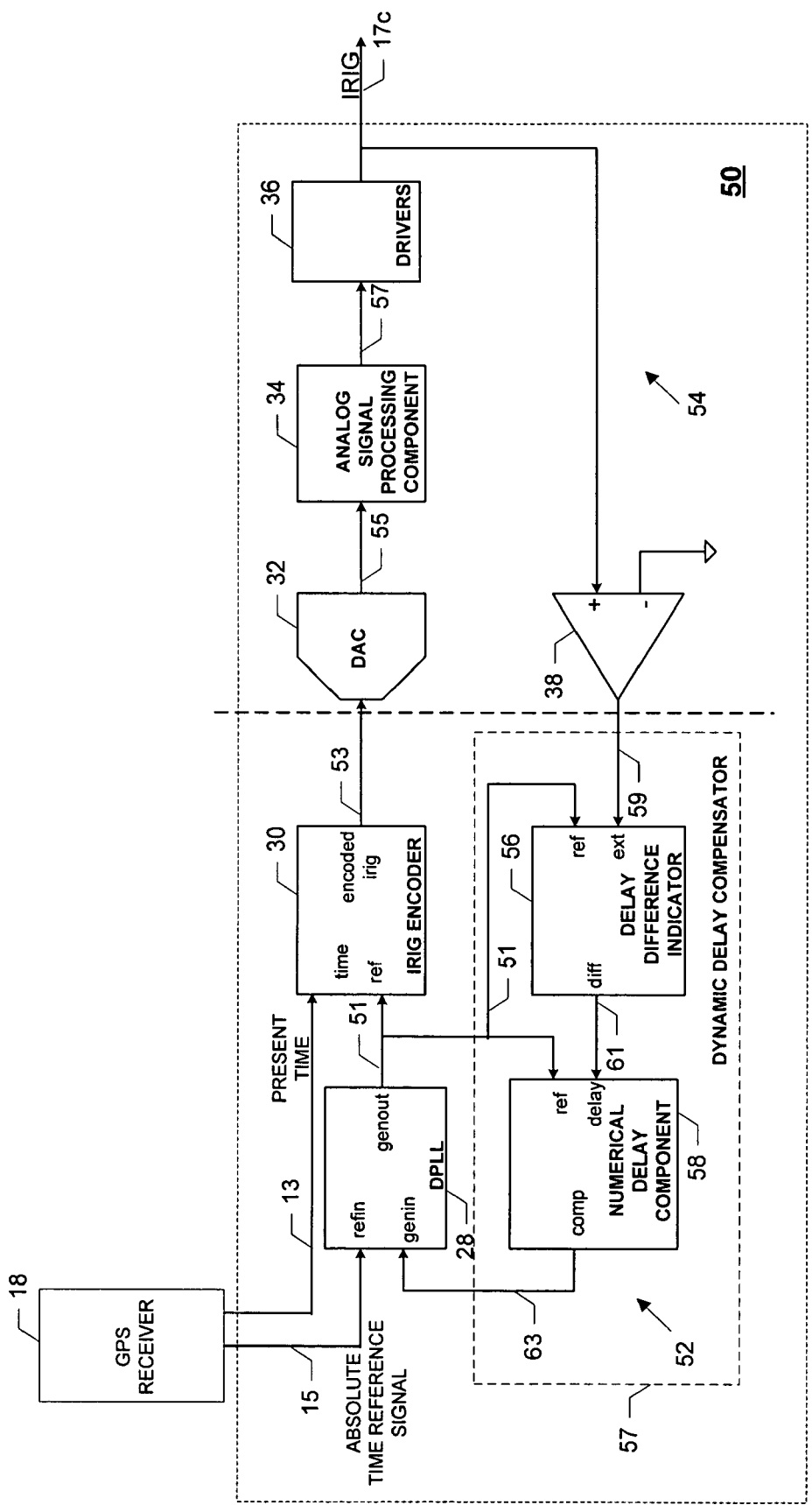
FIG. 4 is a block diagram of yet another self-calibrating time code generator of the system of FIG. 1 that may be utilized to generate the accurate time waveform, according to yet another embodiment of the invention.

FIG. 4 is a block diagram of yet another self-calibrating time code generator 50 that may be utilized to generate an accurate time waveform configured as an IRIG waveform 17c, according to yet another embodiment of the invention. Like the self-calibrating time code generator 42 of FIG. 3, the self-calibrating time code generator 50 includes the DPLL, the IRIG encoder, the DAC, the analog signal processing component, the analog driver(s) and the comparator, configured and operational as described above. For ease of discussion however, the digital components 52 of the self-calibrating time code generator 30 are referred to herein as the DPLL 28, the IRIG encoder 30, and the analog components 54 of the self-calibrating time code generator 50 are referred to herein as the DAC 32, the analog signal processing component 34, the analog driver(s) 36 and the comparator 38.

Unlike the self-calibrating time code generator 42 of FIG. 3, the self-calibrating time code generator 50 of FIG. 4 includes a dynamic delay compensator 57 having a delay difference indicator 56 and a numerical delay component 58 configured as a separate feedback control path to automatically and continuously compensate for delays due to analog component 54 variations, implementation delays, IRIG encoder 50 operation or line delays. The dynamic delay compensator 57 is also configured to remove waveform anomalies due to atypical noise events, without performance penalty. Such anomalous noise events may be caused by large transients, faults, burst noise events and ESD, and are not adequately addressed by operation of the DPLL 28. Although preferably implemented in an FPGA, the delay difference indicator 56 and the numerical delay component 58 may also be implemented by a microcontroller such as the microcontroller 20 of FIG. 1

As illustrated in FIG. 4, the DPLL 28 has a first input $ref_{IN}$ adapted to receive the absolute time reference signal 15 provided by the global positioning system receiver 18 of the time source 12 of FIG. 1, a second input $gen_{IN}$ adapted to receive a compensated generated input signal 63, and an output $gen_{OUT}$ adapted to provide a generated output signal 51. The generated output signal 51 is based on the phase difference between absolute the time reference signal 15 and the compensated generated input signal 63, where the compensated generated input signal 63 is the generated output signal 51 after shifting in time. Unlike the generated input signal 47 of FIG. 3 however, the compensated generated input signal 63 is generated via operation of the delay difference indicator 56 and the numerical delay component 58.

The self-calibrating time code generator 50 also includes the IRIG encoder 30 operatively coupled to the DPLL 28. The IRIG encoder 30 has a first input time adapted to receive the present time value 13 and a second input ref adapted to receive the generated output signal 51. The IRIG encoder 30 is configured to couple the generated output signal 51 with the present time value 13 to generate a digitally encoded IRIG waveform, or digital IRIG waveform 53. Using an IRIG-B format, the digital IRIG waveform 53 includes the time-of-year provided by the present time value 13, represented by the 100, ten-millisecond pulses of a shifted one-second time frame, where the shift includes any delay compensation provided by the DPLL 28, the delay difference indicator 56 and the numerical delay component 58.

Figure 5:
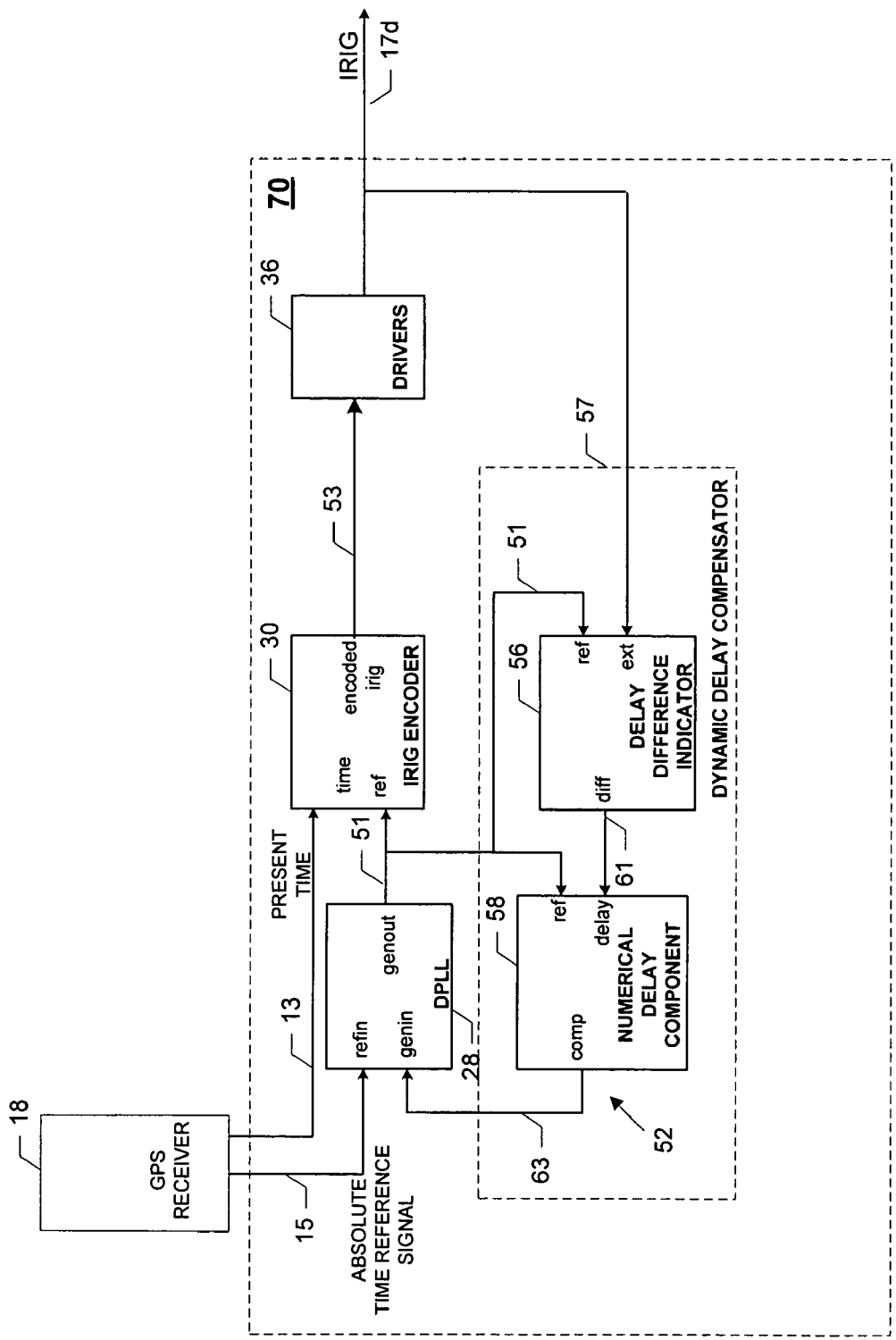
FIG. 5 is a block diagram of a further self-calibrating time code generator of the system of FIG. 1 that may be utilized to generate the accurate time waveform, according to a further embodiment of the invention.

For digital transmission applications, the digital IRIG waveform 53 may be directly utilized by the devices 16 (see, FIG. 5). For analog transmission applications, the digital IRIG waveform 53 may be modulated via the IRIG encoder 30, and further processed to form a conditioned analog IRIG waveform. In such cases, the self-calibrating time code generator 50 further includes the DAC 32 and the analog signal processing component 34. A modulated analog signal 55 from the DAC 32 is then amplified, offset shifted and filtered using well-known methods via the analog signal processing component 34 to form the IRIG waveform 17c configured as the conditioned analog IRIG waveform.

The analog driver(s) 36 is also included in the self-calibrating time code generator 50 to minimize the effects of line loading (e.g., line-induced delay distortions) on the analog components 54 caused by lines connected to multiple devices or loads 16. Further, in cases where the IRIG waveform 17c is configured as the conditioned analog IRIG waveform, the self-calibrating time code generator 50 also includes the comparator 38 to convert the conditioned analog IRIG waveform into the IRIG edge-arrival time waveform 59 comprising a series of pulses as described in connection with FIG. 3. The series of pulses of the IRIG edge-arrival time waveform 59 represent the IRIG absolute time information included.

Configured as a separate feedback control path from the DPLL feedback control path, the dynamic delay compensator 57, having the delay difference indicator 56 and the numerical delay component 58, provides dynamic delay compensation for any time delay due to self-calibrating time code generator 50 implementation, analog component characteristics (e.g., component aging, component temperature) and line-induced delays. Furthermore, operation of the delay difference indicator 56 and the numerical delay component 58 prevents waveform anomalies and the affects of severe noise events, such as large transient signals, from affecting the delay compensation operation, without performance penalty.

Referring again to FIG. 4, the delay difference indicator 56 has a first input ref adapted to receive the generated output signal 51, a second input ext adapted to receive the IRIG edge-arrival time waveform 59, and an output diff adapted to provide a time interval value 61 based on a comparison in time of (1) a positive leading edge of a pulse of a one-second time frame of the generated output signal 51 and (2) a positive leading edge of a pulse of a corresponding one-second time frame of the IRIG edge-arrival time waveform 59. As a result, the time interval value 61 represents delay contributions from the IRIG encoder 30, the DAC 32, the analog signal processing component 34, the driver(s) 36, any associated line delays and a small delay due to the comparator 38.

The numerical delay component 58 has a first input ref adapted to receive the generated output signal 51, a second input delay adapted to receive the time interval value 61, and an output comp adapted to provide the compensated generated input signal 63 based the generated output signal 51 and the time interval value 61, where the generated output signal 51 is shifted in time (delayed) by the time interval value 61 to form the compensated generated input signal 63.

The numerical delay component 58 may be implemented in one of a number of ways. For example, the numerical delay component 58 may be implemented using a first-in-first-out (FIFO) buffer, where the length of the FIFO buffer is dynamically set based on the time interval value 61. The numerical delay component 58 may also be implemented using one or more counter(s) to recreate the generated output signal 51, which is delayed by the time interval value 61 to form the compensated generated input signal 63. In that case, the time interval value 61 is converted to counter units for ease of use with the generated output value 51.

During operation of the counter, each positive leading edge of the generated output signal 51 is detected. Upon detection, the counter starts to increment. When the counter value reaches the time interval value 61, the numerical delay component 58 generates a signal identical to the generated output signal 51 as the compensated generated input signal 63. Thus, the compensated generated input signal 63 is encoded as an identical copy of the generated output signal 51, except the compensated generated input signal 63 is delayed in time by the time interval value 61. The counter is reset after each update of the compensated generated input signal 63, to be ready for the next generated output signal 51.

As mentioned above, each one-second time frame of the generated output signal 51 includes one pulse while each one-second time frame of the IRIG edge-arrival time waveform 59 includes 100, 10-millisecond pulses. During operation, the delay difference indicator 56 measures a time interval that begins with receipt of a pulse of the generated output signal 51 and ends with receipt of a corresponding pulse of the IRIG edge-arrival time waveform 59, and provides the time interval value 61. More specifically, the time interval value 61 is computed by comparing a first numerical timer value recorded at the time of arrival of a positive leading edge of a pulse of the generated output signal 51 with a second numerical timer value recorded at the time of arrival of a positive leading edge of a next pulse of the IRIG edge-arrival time waveform 59. The difference between the two numerical timer values yields the time interval value 61.

The accuracy of the time interval value 61 is determined by the resolution of the numerical timer generating the first and second numerical timer values. Thus, operation of the delay difference indicator 56 compensates for noise and other anomalies by rejecting any signal appearing at the second input ext that is outside of the expected maximum rate of arrival of the IRIG edge-arrival time waveform 59 or that exceeds any other known operating characteristic of the IRIG edge-arrival time waveform 59.

Because of slow variations in the time delays due to the IRIG encoder 30, the DAC 32, the analog signal processing component 34 and the driver(s) 36, and line loading between the driver(s) 36 and the comparator 38, with respect to the rate of the generated output signal 51 and the IRIG edge-arrival time waveform 59, the delay difference indicator 56 is adapted to be selective in terms of which positive leading edges of the IRIG edge-arrival time waveform 59 are used to compute the time interval value 61. Specifically, the nominal rate of an IRIG-B positive leading pulse edge is once per 10 ms. Any positive leading pulse edge arriving outside of the nominal rate (e.g., noise pulse) is rejected, and not used by the delay difference indicator 56 to compute the time interval value 61. Such an algorithm of the delay difference indicator 56 is based on the statistics of expected noise sources, along with a small error term due to a nominal comparator delay. The small error term can be approximately compensated by subtracting a constant, representative of the nominal comparator 38 delay, from the time interval value 61. Thus, the time interval value 61 represents the time delay introduced by the IRIG encoder 30, the DAC 32, the analog signal processing component 34 and the driver(s) 36. The time interval value 61 also represents the line-induced delay between the driver(s) 36 and the comparator 38. While not separately illustrated, filtering algorithms may be included in the delay difference indicator 56 to reduce the statistical variation of edge arrival times.

As discussed above, the numerical delay component 58 delays the generated output signal 51 by the time interval value 61 to provide the compensated generated input signal 63. As a result, receipt of the compensated generated input signal 63, the DPLL 28 is compelled to compensate for the delays mentioned above via a delay equivalent to the time interval value 61.

For example, if the delay introduced by the IRIG encoder 30, the DAC 32, the analog signal processing component 34, the driver(s) 36 and any loading delay is 413 microseconds, then when in dynamic equilibrium, the delay difference indicator 56 and the numerical delay component 58 will reproduce the 413 microsecond delay as follows. First, due to the 413 microseconds delay, the generated output signal 51 will lead the IRIG edge-arrival time waveform 59 with corresponding time-matched positive leading pulse edges, shifted 413 microseconds apart. As a result, the delay difference indicator 56 will provide the time interval value 61 of 413 microseconds. The 413 microseconds delay, delivered via the compensated generated input signal 63 to the second input gen$_{IN}$, will then compel the DPLL 28 to operate such that the generated output signal 51 will lead the absolute time reference signal 15 by 413 microseconds. As a result, the delay caused by the IRIG encoder 30, the DAC 32, the analog signal processing component 34 and the driver(s) 36, and loading, is compensated and corresponding positive leading pulse edges of the IRIG signal 17c and the absolute time reference signal 15 match in time. The self-calibrating time code generator 50 is then maintained in delay compensation equilibrium by the feedback control loop.

As will be appreciated by those skilled in the art, the update rate reflected by the delay difference indicator 56 does not affect the overall DPLL acquisition time because the delay difference indicator 56 and the numerical delay component 58 provide the separate feedback control path. As a result DPLL performance can be optimized independent from the expected transient noise characteristics of the IRIG edge-arrival time waveform 59.

FIG. 5 is a block diagram of a further self-calibrating time code generator 70 that may be utilized to generate the accurate time waveform configured as an IRIG-waveform 17d, according to a further embodiment of the invention. Configured and operational as described in connection with the digital components 52 of FIG. 4, the self-calibrating time code generator 70 provides the IRIG waveform 17d, in the form of a delay compensated, digital IRIG waveform, to the devices or loads 16.

As may be apparent from the above discussion the separate feedback control path enabled via the delay difference indicator 56 and the numerical delay component 58 of the dynamic delay compensator 57 provides dynamic delay compensation for time delays due to implementation, processing and line-induced delays. That is, operation of the delay difference indicator 56 and the numerical delay component 58 compensates for any delays due to distribution of the accurate time waveform, thereby yielding correct real-time placement of the pulse edges of the accurate time waveform. Furthermore, operation of the delay difference indicator 56 and the numerical delay component 58 removes waveform anomalies and the effects of severe noise occurrences without performance penalty.

While this invention has been described with reference to certain illustrative aspects, it will be understood that this description shall not be construed in a limiting sense. Rather, various changes and modifications can be made to the illustrative embodiments without departing from the true spirit, central characteristics and scope of the invention, including those combinations of features that are individually disclosed or claimed herein. Furthermore, it will be appreciated that any such changes and modifications will be recognized by those skilled in the art as an equivalent to one or more elements of the following claims, and shall be covered by such claims to the fullest extent permitted by law.

What is claimed is:

1. A self-calibrating time code generator for generating an accurate time waveform suitable for timing use by a device, the self-calibrating time code generator comprising:

a phase-locked loop configured to provide a generated output signal based on a phase difference between a time reference signal and an input signal;

a time data encoder configured to couple a present time value with the generated output signal to form the accurate time waveform; and a frequency divider operatively coupled to the time data encoder and configured to form the input signal having an edge rate different from an edge rate of the accurate time waveform.

2. The self-calibrating time code generator of claim 1, wherein the accurate time waveform comprises a one-hundred pulse-per-second signal.

3. The self-calibrating time code generator of claim 2, wherein the time reference signal comprises a one pulse-per-second signal.

4. The self-calibrating time code generator of claim 3, wherein the frequency divider decreases the edge rate of the accurate time waveform from one-hundred pulses-per-second to one pulse-per-second.

5. The self-calibrating time code generator of claim 1, wherein self-calibrating time code generator compensates for one or more of a component delay, an implementation delay and a line-loading delay of the self-calibrating time code generator.

6. The self-calibrating time code generator of claim 1, wherein the present time signal and the time reference signal are provided by a global positioning system receiver operatively coupled to the self-calibrating time code generator.

7. The self-calibrating time code generator of claim 1, wherein the accurate time waveform comprises a one-thousand pulse-per-second signal.

8. A self-calibrating time code generator for generating an accurate digital IRIG waveform suitable for timing use by a device, the time source comprising:

a phase-locked loop configured to provide a generated output signal based on a phase difference between a time reference signal and an input signal;

an IRIG encoder configured to couple a present time value with the generated output signal to form a digital IRIG waveform; and a dynamic delay compensator operatively coupled to the phase-locked loop and configured as a separate feedback control path from the phase-locked loop to provide the input signal based on the generated output signal and the digital IRIG waveform, wherein the input signal includes a time delay, the time delay causing the phase-locked loop to time-align the digital IRIG waveform with the time reference signal to form the accurate digital IRIG waveform.

9. The self-calibrating time code generator of claim 8, further comprising at least one driver operatively coupled to the IRIG encoder.

10. The self-calibrating time code generator of claim 8, wherein the time delay includes one or more of a component delay, an implementation delay and a line-loading delay of the self-calibrating time code generator.

11. The self-calibrating time code generator of claim 8, wherein the dynamic delay compensator comprises:

a delay difference indicator configured to provide a time interval value based on a comparison of corresponding pulse edges of the generated output signal and the digital IRIG waveform; and a numerical delay component configured to delay the generated output signal by the time interval value to form the input signal, receipt of the input signal by the phase-locked loop causing the generated output signal to lead the time reference signal by the time interval value to time-align the digital IRIG waveform with the time reference signal to form the accurate digital IRIG waveform.

12. The self-calibrating time code generator of claim 11, wherein the time interval value is provided by calculating a difference between a first numerical timer value recorded at a time of arrival of an edge of a pulse of the generated output signal to a second numerical timer value recorded at a time of arrival of a corresponding edge of a next pulse of the digital IRIG waveform.

13. The self-calibrating time code generator of claim 8, wherein the present time signal and the time reference signal are provided by a global positioning system receiver operatively coupled to the self-calibrating time code generator circuit.

14. The self-calibrating time code generator of claim 8, wherein the phase-locked loop comprises a digital phase-locked loop.

15. The self-calibrating time code generator of claim 8, wherein the digital IRIG waveform comprises a one-hundred pulse-per-second signal.

16. The self-calibrating time code generator of claim 8, wherein the time reference signal comprises a one pulse-per-second signal.

17. The self-calibrating time code generator of claim 8, wherein the digital IRIG waveform comprises a one-thousand pulse-per-second signal.

18. A self-calibrating time code generator for generating an accurate analog IRIG waveform suitable for timing use by a device, the self-calibrating time code generator comprising:

a phase-locked loop configured to provide a generated output signal based on a phase difference between a time reference signal and an input signal;

an IRIG encoder configured to couple a present time value with the generated output signal to form a digital IRIG waveform;

a plurality of analog components operatively coupled to the IRIG encoder and configured to transform the digital IRIG waveform to a conditioned analog IRIG waveform;

a delay difference indicator operatively coupled to the phase-locked loop and configured to provide a time interval value based on a comparison of corresponding pulse edges of the generated output signal and an IRIG edge-arrival time waveform formed from the conditioned analog IRIG waveform; and a numerical delay component operatively coupled to the phase-locked loop and configured to delay the generated output signal by the time interval value to form the input signal, receipt of the input signal by the phase-locked loop causing the generated output signal to lead the time reference signal by the time interval value to time-align the conditioned analog IRIG waveform with the time reference signal to form the accurate analog IRIG waveform.

19. The self-calibrating time code generator of claim 18, further comprising a comparator adapted to form the IRIG edge-arrival time waveform from the modulated analog IRIG waveform.

20. The self-calibrating time code generator of claim 18, further comprising at least one driver operatively coupled to the IRIG encoder.

21. The self-calibrating time code generator of claim 18, wherein the time delay includes one or more of a component delay, an implementation delay and a line-loading delay of the self-calibrating time code generator.

22. The self-calibrating time code generator of claim 18, wherein the plurality of analog components comprise:
- a digital-to-analog converter to convert the digital IRIG waveform into a modulated analog signal representative of the digital IRIG waveform; and
- an analog signal processing component configured to offset shift and filter the modulated analog signal to form the conditioned analog IRIG waveform.

23. The self-calibrating time code generator of claim 18, wherein the time interval value is provided by calculating a difference between a first numerical timer value recorded at a time of arrival of an edge of a pulse of the generated output signal to a second numerical timer value recorded at a time of arrival of a corresponding edge of a next pulse of the digital IRIG waveform.

24. The self-calibrating time code generator of claim 18, wherein the present time signal and the time reference signal are provided by a global positioning system receiver operatively coupled to the self-calibrating time code generator circuit.

25. The self-calibrating time code generator of claim 18, wherein the digital IRIG waveform comprises a one-hundred pulse-per-second signal.

26. The self-calibrating time code generator of claim 18, wherein the time reference signal comprises a one pulse-per-second signal.

27. The self-calibrating time code generator of claim 18, wherein the phase-locked loop comprises a digital phase-locked loop.

28. A method for self-calibrating a time-code generator to time-align an IRIG waveform generated by the time-code generator with a time reference signal to form an accurate IRIG waveform, the time-code generator including a phase-locked loop adapted to provide a generated output signal based on a phase difference between the time reference signal and an input signal the method comprising:
- providing a delay difference indicator configured to calculate a time interval value based on a comparison of a pulse edge of the IRIG waveform and a corresponding pulse edge of the generated output signal; and
- providing a numerical delay component configured to delay the generated output signal by the time interval value to form the input signal, receipt of the input signal by the phase-locked loop causing the generated output signal to lead the time reference signal by the time interval value to time-align the IRIG waveform with the time reference signal to form the accurate IRIG waveform.

29. The method for calibrating of claim 28, wherein the time delay includes one or more of a component delay, an implementation delay and a line-loading delay of the time-code generator.

30. The self-calibrating time code generator of claim 18, wherein the digital IRIG waveform comprises a one-thousand pulse-per-second signal.

* * * * *